United States Patent
Ryu et al.

(10) Patent No.: US 6,800,525 B2
(45) Date of Patent: *Oct. 5, 2004

(54) METHOD OF MANUFACTURING SPLIT GATE FLASH MEMORY DEVICE

(75) Inventors: Eui-Youl Ryu, Yongin (KR); Jae-Min Yu, Seoul (KR); Jin-Woo Kim, Suwon (KR); Jae-Hyun Park, Seoul (KR); Yong-Hee Kim, Suwon (KR); Don-Woo Lee, Suwon (KR); Dai-Geun Kim, Yongin (KR); Sag-Wook Park, Seoul (KR); Joo-Chan Kim, Suwon (KR); Kook-Min Kim, Yongin (KR); Min-Soo Cho, Sungnam (KR); Chul-Soon Kwon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/631,186

(22) Filed: Jul. 31, 2003

(65) Prior Publication Data

US 2004/0027861 A1 Feb. 12, 2004

(30) Foreign Application Priority Data

Aug. 7, 2002 (KR) .................................... 2002-0046499

(51) Int. Cl.⁷ ............................................ H01L 21/336
(52) U.S. Cl. ...................... 438/257; 438/266; 438/267
(58) Field of Search ................................ 438/257–267

(56) References Cited

U.S. PATENT DOCUMENTS 6,524,915 B2 * 2/2003 Kim et al. .................. 438/267

6,541,324 B1 * 4/2003 Wang ......................... 438/201

OTHER PUBLICATIONS

Mih, R., "0.18um Modular Triple Self–Aligned Embedded Split–Gate Flash Memory," 2000 Symposium on VLSI Technology Digest of Technical Papers, pp. 120–121.

* cited by examiner

Primary Examiner—Jack Chen
(74) Attorney, Agent, or Firm—Mills & Onello, LLP

(57) ABSTRACT

The method of manufacturing a split gate flash memory device includes the steps of (a) providing a semiconductor substrate of a conductivity type opposite to that of a first junction region; (b) sequentially forming a first dielectric film, a first conductive film, a second dielectric film and a third dielectric film on an overall upper face of the substrate; (c) etching the third dielectric film by a given thickness so as to expose the second dielectric film; (d) removing the exposed second dielectric film, and eliminating the remaining third dielectric film; (e) etching the first conductive film and the second dielectric film by a given thickness so as to partially expose the first conductive line and the first conductive film; (f) forming a fourth dielectric film on a portion of the exposed first conductive line and first conductive film; (g) eliminating the remaining second dielectric film remained, and exposing the first conductive film provided in a lower part thereof; and (h) etching the first dielectric film and the first conductive film exposed by the removal of the second dielectric film using the fourth dielectric film as an etch mask, and forming a second gate dielectric film and a word line.

13 Claims, 6 Drawing Sheets

METHOD OF MANUFACTURING SPLIT GATE FLASH MEMORY DEVICE

BACKGROUND OF THE INVENTION

1. Field of the Invention

The present invention relates to a method of manufacturing a non-volatile memory device; and more particularly, to a method of manufacturing a flash memory device having a split gate.

2. Description of the Related Art

Recently, a split gate flash memory device is manufactured in such a way that a floating gate and a control gate are split. The device is commonly used as a portable data storage device.

A prior art manufacturing method of such a split gate flash memory device is disclosed in the thesis of Rebecca Mih, entitled, "0.18 um Modular Triple Self-Aligned Embedded Split-Gate Flash Memory," (2000 Symposium on VLSI Technology Digest of Technical Papers. pp. 120–121, 2000).

In fabricating such a split gate flash memory device, resistance of a word line may be high, and a short between the word line and a drain junction region may be caused.

SUMMARY OF THE INVENTION

Therefore, an object of the present invention is to provide a method of fabricating a split gate flash memory device, which is capable of reducing resistance of a word line.

Another object of the present invention is to provide a method of fabricating a split gate flash memory device, which is capable of preventing a short between a word line and a drain junction region.

To achieve these objects, and in one aspect of the present invention, the method of manufacturing a split gate flash memory device comprises the steps of: (a) providing a semiconductor substrate of a conductivity type opposite to that of a first junction region, the semiconductor substrate being provided with a floating gate, a first spacer surrounding the floating gate, the first junction region of a constant conductivity type, which is overlapped with the first spacer and is formed on the substrate, and a first conductive line contacted with the first spacer and formed on the first junction region; (b) sequentially forming a first dielectric film, a first conductive film, a second dielectric film and a third dielectric film on an overall upper face of the substrate; (c) planarizing the third dielectric film by a given thickness so as to expose the second dielectric film; (d) removing the exposed second dielectric film, and eliminating the remaining third dielectric film; (e) planarizing the first conductive film and the second dielectric film by a given thickness so as to partially expose the first conductive line and the first conductive film; (f) forming a fourth dielectric film on a portion of the exposed first conductive line and first conductive film; (g) eliminating the remaining second dielectric film, and exposing the first conductive film provided in a lower part thereof; (h) etching the first dielectric film and the first conductive film exposed by the removal of the second dielectric film using the fourth dielectric film as an etch mask so as to form a second gate dielectric film and a word line; (i) forming a second spacer on a sidewall of the word line; (j) forming a second junction region of a conductivity type the same as that of the first junction region on the substrate, the second junction region being overlapped with the word line and the second spacer; (k) forming an interlayer dielectric film having a contact hole for exposing the second junction region, on an entire upper face of the substrate; and (l) forming a second conductive line contacted with the second junction region through the contact hole.

It is desirable in step (c) to remove the third dielectric film by a given thickness through a chemical mechanical polishing (CMP) process until the second dielectric film is exposed. It is also desirable in (e) to remove the second dielectric film and the first conductive film by a constant thickness through an etching process.

The third dielectric film is preferably formed as a buffer layer in the CMP process in order to improve step coverage of the first conductive film. It is desirable that the third dielectric film is an HDP film, a TEOS film, or a USG film.

The second dielectric film is a stopper layer in the CMP process performed in step (c), and preferably is the film to protect the first conductive film provided in a lower part thereof, from the etching process executed in step (e).

Preferably, the first junction region is a source junction region, the second junction region is a drain junction region, the first conductive line is a source line made of polysilicon, and the second conductive line is a metallic line.

In step (f), the fourth dielectric film preferably is an oxidation film that is selectively formed through an oxidation process in which the second dielectric film is used as a mask.

The word line has a uniform width and a sidewall of a vertical structure contacted with the second spacer.

According to another aspect of the present invention, the method of manufacturing a split gate flash memory device comprises the steps of (a) providing a semiconductor substrate of a conductivity type opposite to that of a first junction region, the semiconductor substrate being provided with floating gates spaced from each other, first spacers respectively surrounding the floating gates, the first junction region of a constant conductivity type, which is overlapped with the first spacers and is formed on the substrate, and a first conductive line contacted with the first spacer and formed on the first junction region; (b) sequentially forming a first dielectric film, a first conductive film, a second dielectric film and a third dielectric film on an overall upper face of the substrate; (c) planarizing the third dielectric film by a given thickness so as to expose the second dielectric film; (d) removing the exposed second dielectric film, and eliminating the remaining third dielectric film; (e) planarizing the first conductive film and the second dielectric film by a given thickness so as to partially expose the first conductive line and the first conductive film; (f) forming a fourth dielectric film on a portion of the exposed first conductive line and first conductive film; (g) eliminating the remaining second dielectric film, and exposing the first conductive film provided in a lower part thereof; (h) etching the first dielectric film and the first conductive film exposed by the removal of the second dielectric film using the fourth dielectric film as an etch mask, and forming a second gate dielectric film and a word line; (i) forming a second spacer on a sidewall of the word line; (j) forming a second junction region of a conductivity type the same as that of the first junction region on the substrate, the second junction region being overlapped with the word line and the second spacer; (k) forming an interlayer dielectric film having a contact hole for exposing the second junction region on an entire upper face of the substrate; and (l) forming a second conductive line contacted with the second junction region through the contact hole.

With respect to still another aspect of the present invention, the method of manufacturing a split gate flash memory device includes the steps of forming, on a semiconductor substrate, a first conductive film, and sequentially forming a first dielectric film and a second dielectric film which serve as a buffer in planarizing the first conductive film in a subsequent step, and then planarizing the second dielectric film, the first dielectric film and the first conductive film till a first conductive line is exposed, wherein the semiconductor substrate is provided with a floating gate, a first spacer surrounding the floating gate, a first junction region of a constant conductivity type, which is overlapped with the first spacer and is formed on the substrate, and the first conductive line contacted with the first spacer and formed on the first junction region; and forming a word line by etching the first conductive film.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

PREFERRED EMBODIMENT OF THE INVENTION

Hereinafter, preferred embodiments of the present invention will be described in detail with reference to FIGS. 2 and 3.

Figure 1:
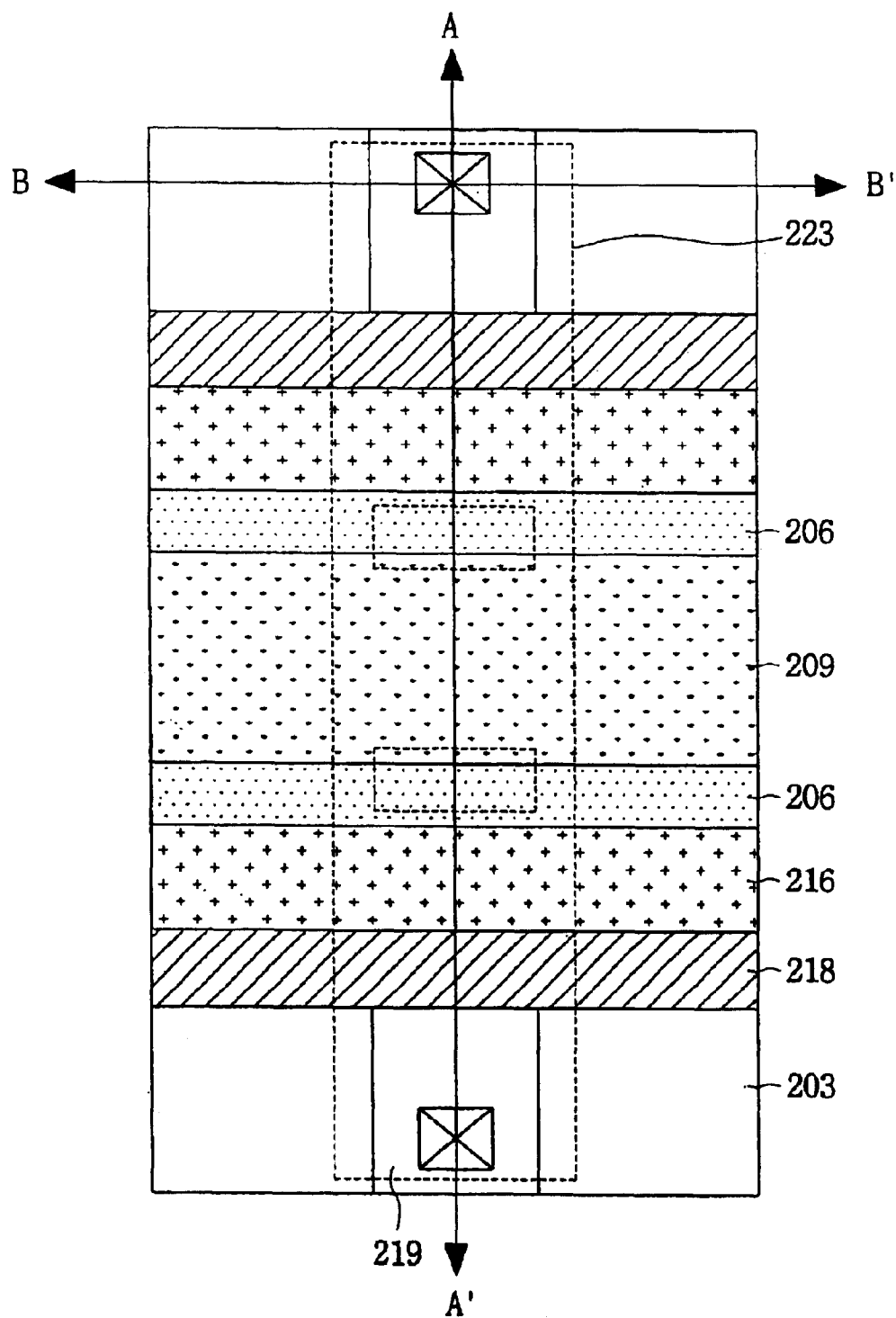
FIG. 1 is a layout of a conventional split gate flash memory device.

FIG. 1 shows a plan of a conventional split gate flash memory device, and FIGS. 2a to 2q, and FIGS. 3a to 3q, illustrate fabrication of a split gate flash memory device in accordance with one embodiment of the present invention.

Figure 2A:
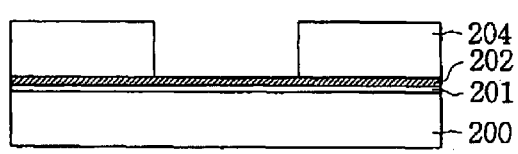
FIGS. 2a to 2q are cross sectional views oriented in the same direction as line A–A' of FIG. 1, illustrating fabrication of a split gate flash memory device in accordance with one embodiment of the present invention.

A plane structure of a split gate flash memory device in the inventive embodiment is same as the layout shown in FIG. 1. FIGS. 2a to 2q show a sectional structure oriented in the same direction as line A–A' FIG. 1 and FIGS. 3a to 3q show a sectional structure oriented in the same direction as line B–B' of FIG. 1, in fabricating a split gate flash memory device in accordance with the inventive embodiment.

With reference to FIGS. 2a to 2q and FIGS. 3a to 3q, a method of fabricating a split gate flash memory device is described in accordance with the present invention.

Figure 3A:
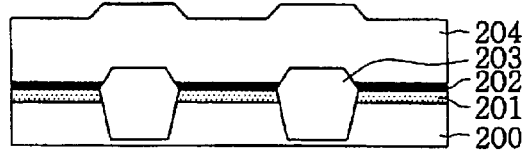
FIGS. 3a to 3q are cross sectional views oriented in the same direction as line B–B' of FIG. 1, illustrating fabrication of a split gate flash memory device in accordance with the present invention.

Referring first to FIGS. 2a and 3a, a first oxide film 201 is formed on an active region of a semiconductor substrate 200, and a first conductive film 202 made of polysilicon is deposited thereon. On its field region, a field oxide film 203 is formed. The field oxide film 203 is formed through an LOCOS (Local Oxidation of Silicon), a PBL (Poly-Buffered LOCOS) or an STI (shallow Trench isolation). In the example structure of FIGS. 2a and 3a, the field oxide film 203 is formed by STI.

In forming the field oxide film through the STI, the first oxide film 201 and the first conductive film 202 are first formed on an entire upper face of a substrate, and a first nitride film (not shown in the drawings) is deposited thereon. The first nitride film, the first conductive film 202 and the first oxide film 201 are patterned through a conventional photolithographic etching so as to expose a portion corresponding to a field region on the substrate. Subsequently, the exposed substrate is etched to form a trench (not shown in the drawings). Next, the oxide film is deposited on the first nitride film containing the trench. The CMP is executed until the first nitride film is exposed, and the field oxide film 203 of the STI-type is then formed with the trench buried with the oxide film.

In the following, the first nitride film remaining on the first conductive film 202 is removed. After forming the STI-type field oxide, a second nitride film 204 is deposited on the substrate, and the general photolithographic etching is then executed so as to be patterned until a portion of the first conductive film 202 is exposed.

Figure 2B:
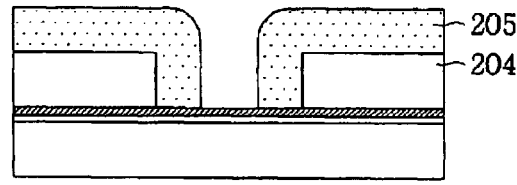
Figure 3B:
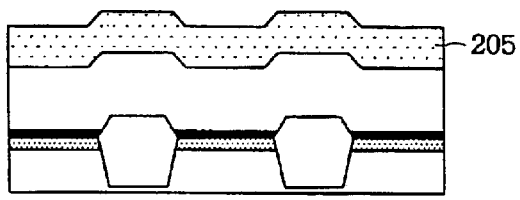

FIGS. 2b and 3b show deposition of a second oxide film 205 on the second nitride film 204 and the first conductive film 202. Though not shown in the drawings, before depositing the second oxide film 205, the first conductive film 202 is etched by a given thickness using the second nitride film 204 as an etch mask, or the exposed first conductive film 202 is oxidized by a given thickness through an oxidation. That is, after such a process, the second oxide film 205 is deposited thereon. Therefore, the exposed portion of the first conductive film 202 becomes relatively thin compared to the non-exposed portion.

Figure 2C:
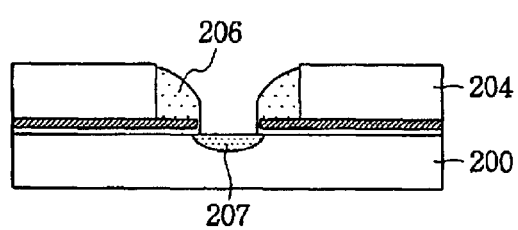
Figure 3C:
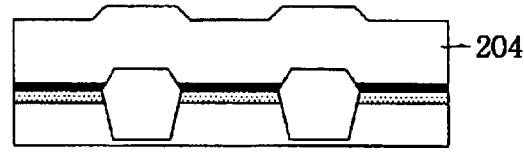

FIGS. 2c and 3c show that the second oxide film 205 is etched back so as to form an oxide spacer 206 on a sidewall of the second nitride film 204. The exposed first conductive film 202 and first oxide film 201 are etched using the spacer 206 as the etch mask so as to expose the substrate.

Impurity ions having the conductivity type opposite to that of the substrate are implanted into the exposed portion of the substrate using the spacer 206 and the second nitride film 204 as the mask, so as to form a source junction region 207.

Herewith, though not shown in the drawings, when the first conductive film 202 and the first oxide film 201 are etched using the spacer 206 as the etch mask, a side face of the first conductive film 202 is exposed. To prevent a short from a source line to be formed in subsequent process steps, a CVD (chemical vapor deposition) oxide film is formed on an overall upper face of the substrate and is then etched back, so as to finally form the spacer 206 of the structure surrounding the first conductive film as shown in FIGS. 2c and 3c. The CVD oxide film may be replaced by a thermal oxide film through a thermal oxidation process.

Figure 2D:
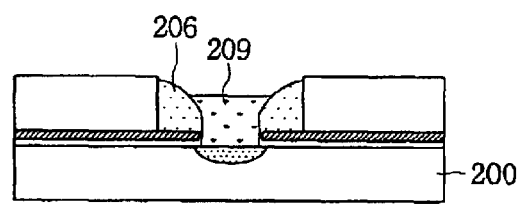
Figure 3D:
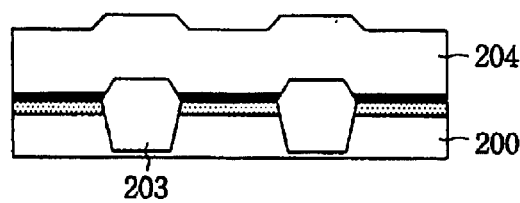

FIGS. 2d and 3d show that a second conductive film made of polysilicon is deposited on an entire upper face of the substrate and is then etched back so as to form a source line 209 that is directly in contact with the source junction region 207. At this time, the source line 209 is isolated from the first conductive film 202 through the spacer 206.

Figure 2E:
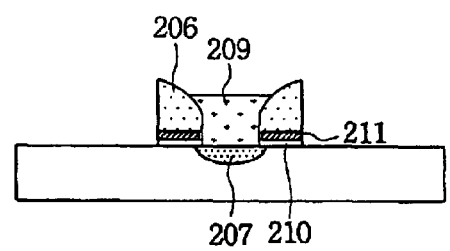
Figure 2F:
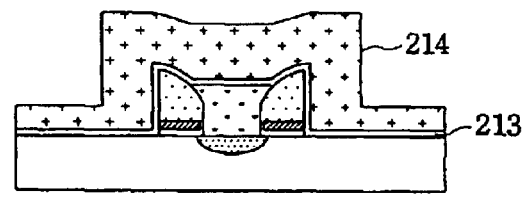
Figure 2G:
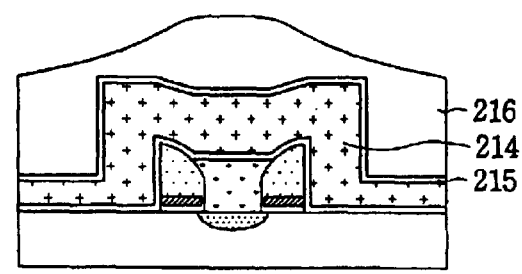
Figure 2H:
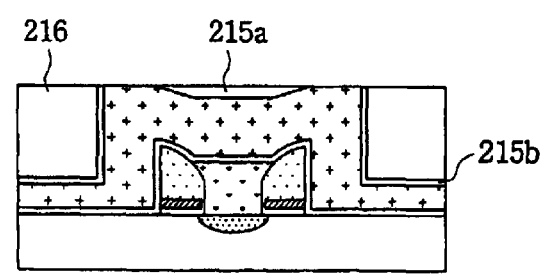
Figure 2I:
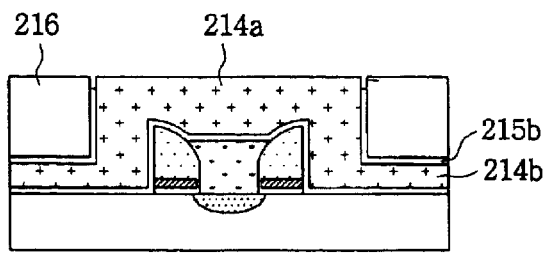
Figure 2J:
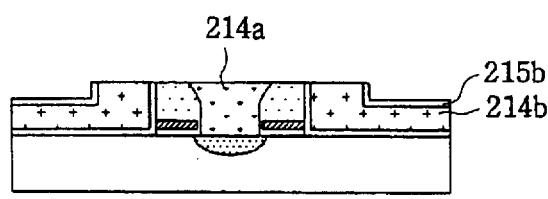
Figure 2K:
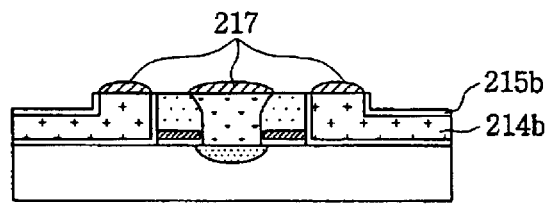
Figure 2L:
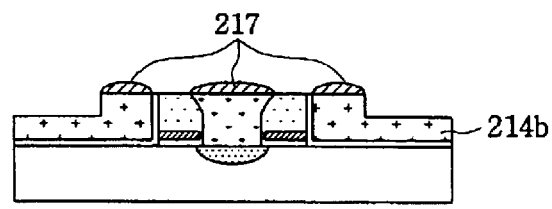
Figure 2M:
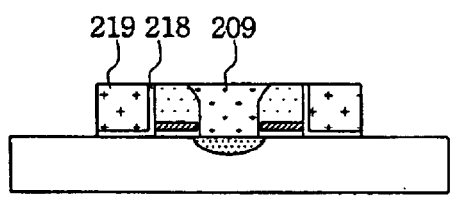
Figure 2N:
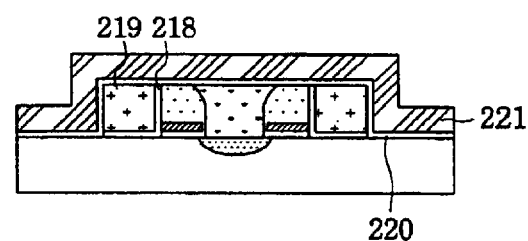
Figure 2O:
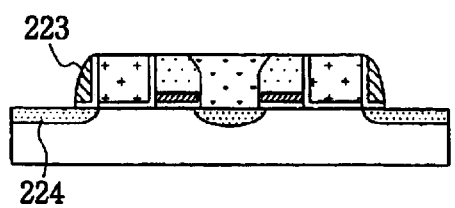
Figure 2P:
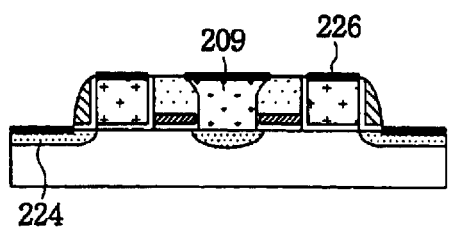
Figure 2Q:
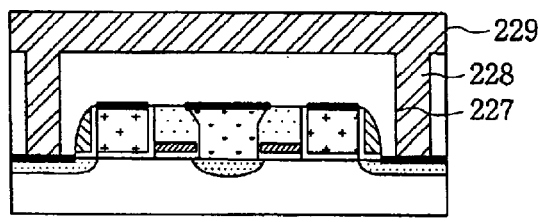
Figure 3E:
Figure 3F:
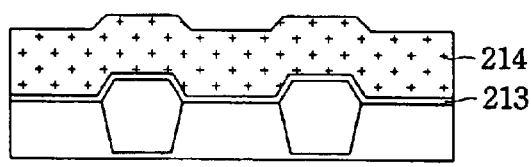
Figure 3G:
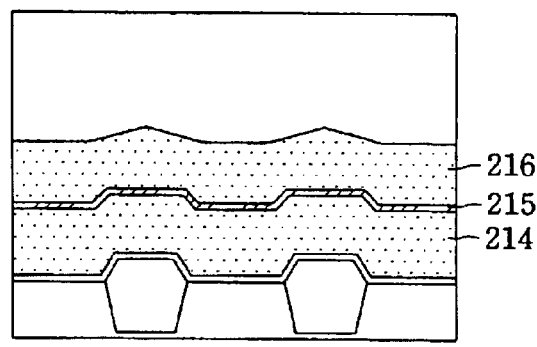
Figure 3H:
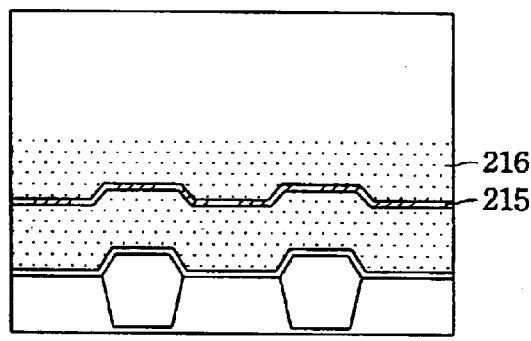
Figure 3I:
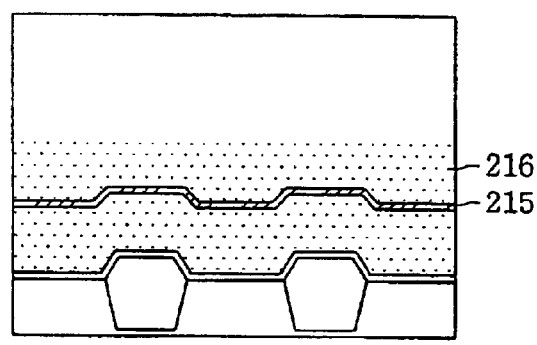
Figure 3J:
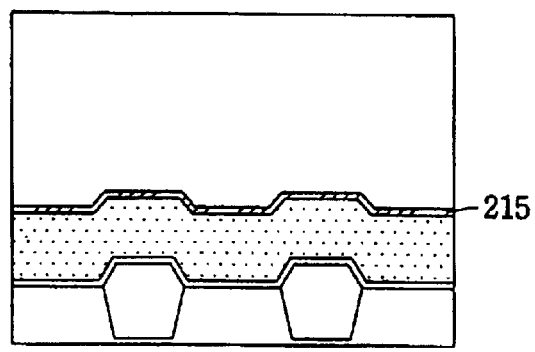
Figure 3K:
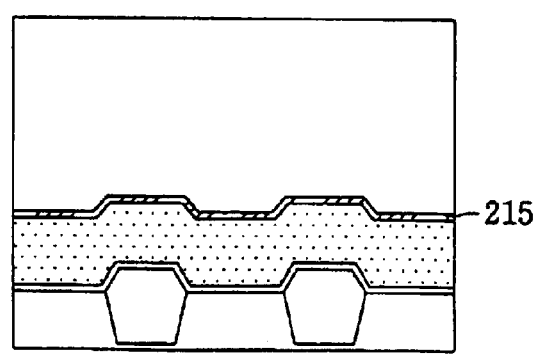
Figure 3L:
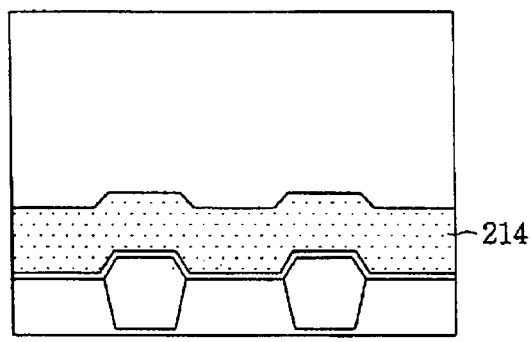
Figure 3M:
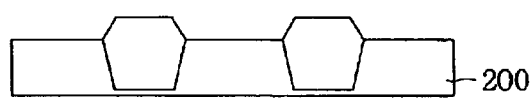
Figure 3N:
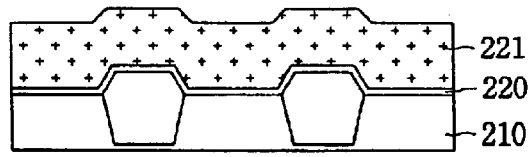
Figure 3O:
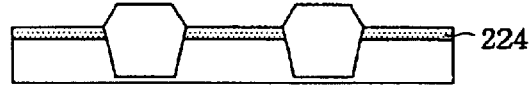
Figure 3P:
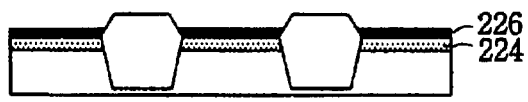
Figure 3Q:
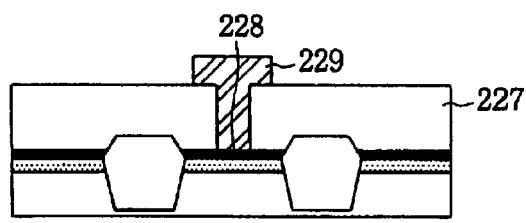

FIGS. 2e and 3e show that the second nitride film 204 is selectively removed using phosphoric acid and then the first conductive film 202 and the first oxide film 201 are etched using the spacer 206 as a mask. Thus, a first gate dielectric film 210 and a floating gate 211 are formed.

FIGS. 2f to 2m and FIGS. 3f to 3m show a process of forming word lines.

On an entire upper face of the substrate, a third oxide film 213 and a third conductive film 214 that is made of polysilicon are formed. On the third conductive film 214, a third nitride film 215 and a fourth oxide film 216 are formed in sequence. The third oxide film 213 is the CVD oxide film formed by a CVD method or the thermal oxide film formed by a thermal oxidation. Due to step coverage between an active region having cells and a field region not having cells, the third conductive film 214 formed thereon has a step coverage. To improve that, the fourth oxide film 216 is formed thereon. A margin in the CMP process to be executed later can become better by improving the step coverage of the third conductive film. The fourth oxide film 216 is an HDP-CVD (High density plasma-CVD) film, a TEOS (Tetra Ethyl Ortho Silicate) film, or a USG (Undoped Silicate Glass) film.

Subsequently, the CMP (Chemical Mechanical Polishing) process is executed so as to etch the fourth oxide film 216 until the third nitride film 215a is exposed, and to planarize it. Such third nitride film 215a becomes a stopper layer to stop any more etch in the CMP process. The exposed third nitride film 215a is removed through a wet etching so as to expose the third conductive film 214a. Then the remaining fourth oxide film 216 is eliminated through the etching. Next, the third conductive film 214 is etched in the etching process until the source line 209 is exposed. In such an etching process, the third nitride film 215b becomes the protective film to protect the third conductive film 214b from etching.

The oxidation process is executed using, as an oxidation mask, the third nitride film 215b remaining after the etching process, so as to oxidize an exposed portion of the source line 209 and an exposed portion of the third conductive film 214 and to then selectively form a fifth oxide film 217.

In the following, the third nitride film 215b served as the oxidation mask is removed through the wet etching so as to expose the third conductive film 214b. The third conductive film 214b and the third oxidation film 213 are etched using the fifth oxide film 217 as an etch mask so as to form a second gate dielectric film 218 and a word line 219. The fifth oxide film 217 is then eliminated through the wet etching.

Instead of forming the word line by a conventional spacer type, in the inventive embodiment the third conductive film 214 made of polysilicon is etched using the fifth oxide film 217 as the mask, to thereby form the word line. The present invention thus has the vertical sidewall structure not a slow sidewall, and has the word line 219 of a uniform width.

The step coverage between the active region and the field region is smoothened by forming the fifth oxide film, which can improve a margin of a profile in the CMP process subsequently to be performed.

Further, the third nitride film becomes the stopper layer in the CMP process of the fourth oxide film, and further becomes the protective film of the third conductive film in the etching process of the third conductive film, which improve a profile margin of the source and word lines.

FIGS. 2n and 2o and FIGS. 3n and 3o show a process of forming a nitride film spacer and a drain junction region. On an overall upper face of the substrate, a sixth oxide film 220 and a fourth nitride film 221 are deposited in sequence, and are then etched back. Thereafter a nitride film spacer 223 is formed on a sidewall of a word line 219.

Ions of a conductivity type the same as that of the source junction region are implanted in the exposed substrate using an ion implantation mask (not shown in the drawings), to thus form a drain junction region 224.

FIGS. 2p and 2q and FIGS. 3p and 3q show a process of forming a metal wire. On the exposed source line 209, drain junction region 224 and word line 219, a silicide film 226 is formed.

An interlayer dielectric film 227 is deposited on an entire upper face of the substrate, and is then etched so as to expose the drain junction region 224 and form a contact hole 228. Next a metal film is deposited and patterned, to thus form a metal wire 229 contacted with the drain junction region 224 through the contact hole 228. Whereby a split gate flash memory device is manufactured according to one embodiment of the present invention.

In accordance with one embodiment of the present invention, the fourth oxide film slows the step coverage of the first conductive film caused between the field region and the active region, and becomes a buffer layer in the CMP process to be performed later, thereby improving a margin of profile.

Further, the third nitride film becomes a buffer layer that serves as a stopper layer in the CMP process of the fourth oxide film, and becomes the buffer layer that serves as a protective film of the third conductive film in an etching process of the third conductive film, thereby improving a profile margin of the source and word lines.

Therefore, the word line 219 of a vertical sidewall with a uniform width can be obtained. That is, differently from a word line formed in the conventional spacer process, an area of the word line can become uniform and a resistance of the word line itself can be reduced.

In addition, because the sidewall of the word line 219 has the vertical structure, the nitride film 223 can be formed in the subsequent process steps so as to sufficiently isolate the word line 219 and the drain junction region formed in the subsequent process steps, thereby preventing a short between the word line 219 and the drain junction region 224.

Moreover, the silicide film 226 has an area large enough to reduce a resistance of the word line because residues of the nitride film are not generated on the word line in forming the nitride film spacer.

As described above, in accordance with the present invention, a sidewall of a word line is formed vertically, and its width is formed uniformly. In the inventive method of manufacturing a split gate flash memory device, resistance caused by reduction in area of the word line can be reduced. Additionally, as a nitride film spacer is formed only on a sidewall of the word line in the subsequent process steps, nitride film remaining on the word line can be prevented. Accordingly, resistance of the word line is reduced, and a short between a drain junction region and a word line can be prevented through the nitride film spacer.

Finally, although the present invention was described in detail above in connection with the preferred embodiments thereof, the scope of the invention is not so limited. Rather, various changes and modifications of the preferred embodiments, as will become apparent to those of ordinary skill in the art, are seen to be within the true spirit and scope of the invention as defined by the appended claims.

What is claimed is:

1. A method of manufacturing a split gate flash memory device, comprising the steps of:

(a) providing a semiconductor substrate of a conductivity type opposite to that of a first junction region, the semiconductor substrate being provided with a floating gate, a first spacer surrounding the floating gate, the first junction region of a constant conductivity type, which is overlapped with the first spacer and is formed on the substrate, and a first conductive line contacted with the first spacer and formed on the first junction region;

(b) sequentially forming a first dielectric film, a first conductive film, a second dielectric film and a third dielectric film on an overall upper face of the substrate;

(c) planarizing the third dielectric film by a given thickness so as to expose the second dielectric film;

(d) removing the exposed second dielectric film, and eliminating the remaining third dielectric film;

(e) planarizing the first conductive film and the second dielectric film by a given thickness so as to partially expose the first conductive line and the first conductive film;

(f) forming a fourth dielectric film on a portion of the exposed first conductive line and first conductive film;

(g) eliminating the remaining second dielectric film, and exposing the first conductive film provided in a lower part thereof;

(h) etching the first dielectric film and the first conductive film exposed by the removal of the second dielectric film using the fourth dielectric film as an etch mask, and forming a second gate dielectric film and a word line;

(i) forming a second spacer on a sidewall of the word line;

(j) forming a second junction region of a conductivity type the same as that of the first junction region on the substrate, said second junction region being overlapped with the word line and the second spacer;

(k) forming an interlayer dielectric film having a contact hole for exposing the second junction region, on an entire upper face of the substrate; and (l) forming a second conductive line contacted with the second junction region through the contact hole.

2. The method of claim 1, wherein in step (c), the third dielectric film is removed by a given thickness through a chemical mechanical polishing (CMP) until the second dielectric film is exposed.

3. The method of claim 1, wherein in step (e), the second dielectric film and the first conductive film are removed by a constant thickness through an etching process.

4. The method of claim 1, wherein said third dielectric film becomes a buffer layer in a CMP process to improve step coverage of the first conductive film.

5. The method of claim 1, wherein said third dielectric film is one of an HDP film, a TEOS film, and a USG film.

6. The method of claim 1, wherein said second dielectric film is a stopper layer in a CMP process of step (c), and is the film to protect the first conductive film provided in a lower part thereof from an etching process of step (e).

7. The method of claim 1, wherein said first junction region is a source junction region.

8. The method of claim 1, wherein said second junction region is a drain junction region.

9. The method of claim 1, wherein said first conductive line is a source line made of polysilicon.

10. The method of claim 1, wherein said second conductive line is a metallic line.

11. The method of claim 1, wherein said fourth dielectric film is an oxide film selectively formed through an oxidation in which the second dielectric film is used as an etching mask in step (f).

12. The method of claim 1, wherein said word line has a uniform width and a sidewall of a vertical structure contacted with the second spacer.

13. A method of manufacturing a split gate flash memory device, comprising the steps of:

(a) providing a semiconductor substrate of a conductivity type opposite to that of a first junction region, said semiconductor substrate being provided with floating gates spaced from each other, first spacers respectively surrounding the floating gates, the first junction region of a constant conductivity type, which is overlapped with the first spacers and is formed on the substrate, and a first conductive line contacted with the first spacer and formed on the first junction region;

(b) sequentially forming a first dielectric film, a first conductive film, a second dielectric film and a third dielectric film on an overall upper face of the substrate;

(c) planarizing the third, dielectric film by a given thickness so as to expose the second dielectric film;

(d) removing the exposed second dielectric film, and eliminating the third dielectric film remained;

(e) planarizing the first conductive film and the second dielectric film by a given thickness so as to partially expose the first conductive line and the first conductive film;

(f) forming a fourth dielectric film on a portion of the exposed first conductive line and first conductive film;

(g) eliminating the second dielectric film remained, and exposing the first conductive film provided in a lower part thereof;

(h) etching the first dielectric film and the first conductive film exposed by the removal of the second dielectric film by using the fourth dielectric film as an etch mask, and forming a second gate dielectric film and a word line;

(i) forming a second spacer on a sidewall of the word line;

(j) forming a second junction region of a conductivity type the same as that of the first junction region on the substrate, said second junction region being overlapped with the word line and the second spacer;

(k) forming an interlayer dielectric film having a contact hole for exposing the second junction region on an entire upper face of the substrate; and (l) forming a second conductive line contacted with the second junction region through the contact hole.

* * * * *

UNITED STATES PATENT AND TRADEMARK OFFICE
CERTIFICATE OF CORRECTION

PATENT NO. : 6,800,525 B2
DATED : October 5, 2004
INVENTOR(S) : Eui-Youl Ryu et al.

It is certified that error appears in the above-identified patent and that said Letters Patent is hereby corrected as shown below:

Column 8,
Line 22, delete ",".

Signed and Sealed this

Fifteenth Day of February, 2005

JON W. DUDAS
*Director of the United States Patent and Trademark Office*